US00RE51016E

(19) United States
(12) Reissued Patent
Gao et al.

(10) Patent Number: US RE51,016 E
(45) Date of Reissued Patent: Aug. 25, 2026

(54) INTEGRATED CIRCUIT ASSEMBLIES WITH RIGID LAYERS USED FOR PROTECTION AGAINST MECHANICAL THINNING AND FOR OTHER PURPOSES, AND METHODS OF FABRICATING SUCH ASSEMBLIES

(71) Applicant: ADEIA SEMICONDUCTOR TECHNOLOGIES LLC, San Jose, CA (US)

(72) Inventors: Guilian Gao, Campbell, CA (US); Cyprian Emeka Uzoh, San Jose, CA (US); Charles G. Woychik, San Jose, CA (US); Hong Shen, Palo Alto, CA (US); Arkalgud R. Sitaram, Cupertino, CA (US); Liang Wang, Milpitas, CA (US); Akash Agrawal, San Jose, CA (US); Rajesh Katkar, Milpitas, CA (US)

(73) Assignee: Adeia Semiconductor Technologies LLC, San Jose, CA (US)

(21) Appl. No.: 18/885,445

(22) Filed: Sep. 13, 2024

Related U.S. Patent Documents

Reissue of:
(64) Patent No.: 9,548,273
Issued: Jan. 17, 2017
Appl. No.: 14/704,714
Filed: May 5, 2015

U.S. Applications:
(60) Provisional application No. 62/087,361, filed on Dec. 4, 2014.

(51) Int. Cl.
*H01L 23/48* (2006.01)
*H01L 25/00* (2006.01)
(Continued)

(52) U.S. Cl.
CPC ..... *H10W 70/611* (2026.01); *H10P 72/74* (2026.01); *H10W 70/095* (2026.01);
(Continued)

(58) Field of Classification Search
CPC ..... H10W 70/611; H10W 70/095; H10W 70/635; H10W 70/63; H10W 70/682;
(Continued)

(56) References Cited

U.S. PATENT DOCUMENTS 6,535,398 B1 * 3/2003 Moresco ..... H01L 23/50 257/700
6,693,361 B1 2/2004 Siniaguine et al.
(Continued)

OTHER PUBLICATIONS

International Search Report and Written Opinion received in PCT Application PCT/US2015/063151, mailed Feb. 19, 2016. 12 pages.
(Continued)

*Primary Examiner* — Elizabeth L Mckane
(74) *Attorney, Agent, or Firm* — Knobbe, Martens, Olson & Bear, LLP

(57) ABSTRACT

Die (110) and/or undiced wafers and/or multichip modules (MCMs) are attached on top of an interposer (120) or some other structure (e.g. another integrated circuit) and are covered by an encapsulant (160). Then the interposer is thinned from below. Before encapsulation, a layer (410) more rigid than the encapsulant is formed on the interposer around the die to reduce or eliminate interposer dishing between the die when the interposer is thinned by a mechanical process (e.g. CMP). Other features are also provided.

25 Claims, 9 Drawing Sheets

(51) Int. Cl.

| | |
|---|---|
| ***H10P 72/70*** | (2026.01) |
| ***H10W 70/05*** | (2026.01) |
| ***H10W 70/60*** | (2026.01) |
| ***H10W 70/63*** | (2026.01) |
| ***H10W 72/00*** | (2026.01) |
| ***H10W 74/10*** | (2026.01) |
| ***H10W 90/00*** | (2026.01) |
| *H10W 70/68* | (2026.01) |
| *H10W 70/692* | (2026.01) |
| *H10W 70/698* | (2026.01) |
| *H10W 72/29* | (2026.01) |
| *H10W 72/30* | (2026.01) |
| *H10W 72/50* | (2026.01) |
| *H10W 72/90* | (2026.01) |
| *H10W 74/00* | (2026.01) |
| *H10W 74/15* | (2026.01) |

(52) U.S. Cl.
CPC ..... *H10W 70/635* (2026.01); *H10W 72/073* (2026.01); *H10W 74/117* (2026.01); *H10W 74/121* (2026.01); *H10W 90/00* (2026.01); *H10W 90/401* (2026.01); *H10P 72/7418* (2026.01); *H10W 70/63* (2026.01); *H10W 70/682* (2026.01); *H10W 70/692* (2026.01); *H10W 70/698* (2026.01); *H10W 72/07354* (2026.01); *H10W 72/07553* (2026.01); *H10W 72/07554* (2026.01); *H10W 72/29* (2026.01); *H10W 72/344* (2026.01); *H10W 72/537* (2026.01); *H10W 72/952* (2026.01); *H10W 74/00* (2026.01); *H10W 74/142* (2026.01); *H10W 74/15* (2026.01); *H10W 90/724* (2026.01); *H10W 90/734* (2026.01); *H10W 90/753* (2026.01); *H10W 90/754* (2026.01); *H10W 90/794* (2026.01)

(58) Field of Classification Search
CPC ..... H10W 70/692; H10W 72/073; H10W 70/698; H10W 74/117; H10W 74/121; H10W 90/00; H10W 90/401; H10W 72/07354; H10W 72/07553; H10W 72/07554; H10W 72/29; H10W 72/537; H10W 72/952; H10W 74/00; H10W 74/142; H10W 74/15; H10W 90/724; H10W 90/734; H10W 90/753; H10W 90/754; H10W 90/794; H10P 72/74; H10P 72/7418
See application file for complete search history.

(56) References Cited

U.S. PATENT DOCUMENTS

| | | | | |
|---|---|---|---|---|
| 7,034,401 | B2 | 4/2006 | Savastiouk et al. | |
| 7,605,479 | B2 | 10/2009 | Mohammed | |
| 7,915,080 | B2 * | 3/2011 | Takahashi | H10W 20/023 257/E21.705 |
| 8,405,225 | B2 | 3/2013 | Yu et al. | |
| 8,658,535 | B2 | 2/2014 | Andry et al. | |
| 8,822,336 | B2 | 9/2014 | Tsai et al. | |
| 8,841,752 | B1 | 9/2014 | Chaware et al. | |
| 2002/0039464 | A1 * | 4/2002 | Yoshimura | G02B 6/10 385/14 |
| 2005/0227474 | A1 * | 10/2005 | Mizukoshi | H01L 21/563 438/612 |
| 2006/0027936 | A1 * | 2/2006 | Mizukoshi | H01L 21/563 257/781 |
| 2006/0055028 | A1 * | 3/2006 | Hasunuma | H01L 23/367 257/706 |
| 2006/0070885 | A1 | 4/2006 | Uzoh et al. | |
| 2008/0073795 | A1 | 3/2008 | Kohl et al. | |
| 2009/0212420 | A1 | 8/2009 | Hedler et al. | |
| 2010/0133722 | A1 | 6/2010 | Watanabe | |
| 2011/0210444 | A1 * | 9/2011 | Jeng | H01L 23/13 257/738 |
| 2012/0018870 | A1 | 1/2012 | Chang et al. | |
| 2012/0074585 | A1 | 3/2012 | Koo et al. | |
| 2012/0268899 | A1 | 10/2012 | Haba et al. | |
| 2012/0326326 | A1 * | 12/2012 | Uzoh | H01L 21/3212 257/774 |
| 2013/0070437 | A1 | 3/2013 | Mohammed et al. | |
| 2014/0153210 | A1 | 6/2014 | Uzoh | |
| 2015/0287697 | A1 | 10/2015 | Tsai et al. | |

OTHER PUBLICATIONS

International Search Report and Written Opinion received in PCT Application PCT/2015-063151, mailed Feb. 19, 2016. 12 pages.

Benson et al., "Polymer Adhesives and Encapsulants for Microelectronic Applications," Johns Hopkins APL Technical Digest, vol. 28, No. 1 (2008), pp. 58-71.

Lupinski et al., "Polymeric Materials for Electronics Packaging and Interconnection," ACS Symposium Series, American Chemical Society: Washington, DC, 1989, 24 pages.

Hummler et al., "TSV and Cu—Cu Direct Bond Wafer and Package-Level Reliability," CNSE, University of Albany, Retrieved Apr. 3, 2015, pp. 41-48.

Zoschke et al., "Hermetic Wafer Level Packaging of MEMS Components Using Through Silicon Via and Wafer to Wafer Bonding Technologies," Electronic Components & Technology Conference, 2013, pp. 1500-1507.

Gilleo et al., "Step 10: Encapsulation Materials, Processes and Equipment," Electroiq.com blog article posted 2004, http://electroiq.com/blog/2004/10/step-10-encapsulation-imaterials-pro-cesses-and-equipment-i/, retrieved Apr. 9, 2015, 7 pages.

* cited by examiner

INTEGRATED CIRCUIT ASSEMBLIES WITH RIGID LAYERS USED FOR PROTECTION AGAINST MECHANICAL THINNING AND FOR OTHER PURPOSES, AND METHODS OF FABRICATING SUCH ASSEMBLIES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

The present application *is a reissue of U.S. Pat. No. 9,548,273, which is issued Jan. 17, 2017, from U.S. patent application Ser. No. 14/704,714, filed May 5, 2015, incorporated herein by reference, which* claims priority of U.S. provisional patent application No. 62/087,361, filed 4 Dec. 2014, incorporated herein by reference.

BACKGROUND OF THE INVENTION

The present invention relates to semiconductor integrated circuits (ICs), and more particularly to assemblies of multiple ICs.

FIG. 1 illustrates a typical assembly with multiple ICs 110 connected to a printed circuit board (PCB) 114. Each IC 110 is a die initially fabricated with other die as part of a larger wafer but then separated from the wafer. Oftentimes, die 110 are not attached to the PCB directly because PCB contact pads 114C cannot be spaced as closely from each other as the die's contact pads 110C due to coarser PCB fabrication technologies. Therefore, the die are attached to the PCB through an interposer (ITP) 120; the interposer's top contact pads 120C.T match the die's contact pads 110C, and the interposer's bottom contact pads 120C.B match the PCB contact pads 114C. The interposer thus provides a contact redistribution function. Also, in many assemblies, the die's coefficient of thermal expansion (CTE) is different from the PCB, and the interposer relieves thermal stresses due to the CTE mismatch between the die and the PCB.

The die-to-interposer and interposer-to-PCB attachments are shown at 126, and they can be solder, conductive or anisotropic adhesive, or can be formed by direct diffusion bonding without additional solder or adhesive materials. PCB 114 includes conductive interconnects 114L which interconnect the PCB contact pads 114C in a desired pattern.

Interposer 120 is manufactured based on a substrate 120S, possibly silicon, glass, or some other material. Conductive vias 130 pass through the substrate and terminate at contact pads 120C.T. (Vias 130 can be electrically insulated from substrate 120S by dielectric 134 if the substrate 120S is not dielectric.) On top of substrate 120S, a redistribution layer (RDL) 140 provides the top contact pads 120C.T and also provides conductive lines 140L that connect the vias 130 to contact pads 120C.T (RDL lines 140L may also connect the top contact pads 120C.T to each other, and/or connect the vias 130 to each other.) Lines 140L are electrically insulated from each other and, if needed, from substrate 120S, by RDL dielectric 140D.

Underfill ("UF") 150 is introduced between the die 110 and interposer 120 to glue the die to the interposer around the attachments 126. Underfills reduce the thermal stresses (mechanical stresses generated by thermal expansion) on connections 126, which is especially important if the die CTE in the XY plane (the plane of interposer 120) does not match the interposer. A typical underfill is a plastic organic polymer (e.g. cured epoxy resin), often with additives (e.g. fire retardants), possibly with hard-particle fillers (silica, alumina, or others) used to reduce the underfill CTE and possibly adjust other parameters of interest, and to lower the cost. An encapsulant 160 covers the die to protect them from contaminants and to mechanically strengthen the structure. The encapsulant can be organic polymeric material (possibly with additives, including hard-particle fillers), the same or similar to the underfill materials described above, and can be deposited in a flowable form (liquid or semi-solid, e.g. by molding or without a mold), or by chemical vapor deposition (CVD). Underfill 162 (possibly but not necessarily the same material as 150) can glue the interposer 120 to PCB 114 around the corresponding connections 126.

In many applications, the interposer substrate 120S should be thin to reduce the assembly size and the length of vias 130. However, a thin substrate is fragile and, in addition, is easily warped by internal and external stresses, e.g. thermal stresses. Therefore, in some manufacturing processes, the interposer fabrication starts with a thick substrate 120S, and the substrate is thinned at a later stage. For example, in FIG. 2A, the substrate 120S is initially thick, and the vias 130 penetrate the substrate only partially. Substrate 120S is thinned only after formation of RDL 140 (FIG. 2B); the thinning exposes the vias 130 on the bottom. Further, before the substrate is thinned, it is strengthened by a temporary carrier wafer 210 attached to the interposer's top surface; the carrier wafer provides mechanical strength, reduces warpage, and improves heat dissipation. Mechanical strength is particularly important if the interposer thinning involves mechanical processes such as grinding, lapping, chemical-mechanical polishing (CMP), etc.

Carrier wafer 210 is later removed to allow die attachment to the top of the interposer. Alternative processes are desirable.

SUMMARY

This section summarizes some features of the invention. Other features may be described in the subsequent sections. The invention is defined by the appended claims, which are incorporated into this section by reference.

As is known, carrier wafer attachment and removal is a problematic process that requires a suitable adhesive to glue the carrier wafer to the interposer and then to allow removal of the carrier wafer without leaving a residue or damaging the RDL. Some embodiments of the present invention facilitate use of carrier wafers and do not require carrier wafer removal. In some embodiments, the carrier wafer is omitted.

For example, the interposer thinning (and hence the carrier wafer attachment) can be postponed until after the die attachment. FIG. 3A shows an exemplary structure with the die and the interposer as in FIG. 1 but the interposer has not been thinned. Carrier wafer 210 is attached above the die to the top surface of encapsulant 160. In some embodiments, the carrier wafer remains in the final structure.

Then the structure is thinned (FIG. 3B).

The inventors observed that mechanical thinning processes such as grinding or CMP may cause dishing of the interposer substrate between the die as shown at 220. The dishing amount depends on the final interposer thickness, the materials used, the distance between die 110, and possibly other factors. For example, the dishing can be 0.1 μm or more (more than 5 μm has been observed by the inventors) if the final thickness of interposer substrate 120S is below 100 μm, the substrate is monocrystalline silicon, and the die 110 are at least 0.05 mm from each other.

The inventors believe that the dishing occurs because encapsulant 160 is softer (more compliant) than the die. The compliance can be thought of as the ability to resist deformation. Up to the elastic limit, the compliance can be characterized by the elastic modulus. The encapsulant must be sufficiently compliant to protect the die and the interposer from external and internal stresses, including thermal stresses due to CTE mismatches between the die, the interposer, and the carrier wafer. A typical resin encapsulant's elastic modulus is 1 GPa or less, though higher moduli can be used. The inventors searched for ways to reduce dishing without compromising the protection afforded by compliant encapsulants and, preferably (though not necessarily), without increasing the interposer thickness.

In some embodiments, the inventors reduce dishing by changing the encapsulant structure. In some embodiments, the encapsulant 160 is replaced by at least two layers—see FIGS. 4A, 4B showing the structure before and after thinning respectively: the two layers include a more rigid (i.e. less compliant) lower layer 410, and a possibly more compliant layer 160. Layer 160 can be polymeric encapsulant as in FIG. 1. The more rigid layer 410 may or may not be polymeric. In some embodiments, layer 410 is a non-plastic material, e.g. silicon dioxide or aluminum oxide. Layer 410 resists the mechanical forces that cause dishing between the die.

Advantageously, lower layer 410 may have a CTE that matches the interposer 120 and/or die 110 better than encapsulant 160. (The CTE of interest is primarily in the XY plane, i.e. along the plane of the interposer; all the CTEs in this disclosure are at room temperature unless noted otherwise.) Many polymeric encapsulants have high XY CTEs, possibly 10 ppm/° K or higher, and such CTEs are considerably higher than of many materials commonly used for interposer substrates 120S and for the die's substrates (not shown). For example, the interposer's and die's substrates can be inorganic semiconductor materials, with CTEs below 8 ppm/° K (2.6 ppm/° K for silicon). Interposers' substrates can be glasses or ceramics with XY CTE under 5 ppm/° K (though some glasses and ceramics have higher CTEs). While organic polymer CTEs can be lowered by fillers, such low CTEs change other encapsulant properties (e.g. increase rigidity) and thus undesirably limit encapsulant choices. In contrast, some rigid materials suitable for layer 410 (including silicon oxide, aluminum oxide, and some other inorganic materials) have lower CTEs. If interposer substrate 120S is made of semiconductor or some other low-CTE material, then layer 410 can be CTE-matched to the interposer and the die without losing the soft cushion of encapsulant 160.

Some embodiments use more than two layers, of more than two different materials, to encapsulate the die.

The multi-layer structures such as 410/160 can be used for purposes other than reduced dishing, even if there is no need to reduce dishing, and even when the interposer thinning does not include a mechanical process. The multi-layered encapsulant stiffens the interposer while providing the compliant cushion on top, and this can be useful for example to facilitate thin interposer handling and reduce interposer breakage and warpage. Thus, U.S. Pat. No. 8,841,752 issued Sep. 23, 2014 to Chaware et al. describes stiffening an interposer wafer in which multiple interposers are manufactured; the wafer is stiffened by widening the scribe lines between the adjacent interposers and forming a stiffener on the scribe lines. In some embodiments of the present invention, the interposer wafer is stiffened by layer 410 without widening the scribe lines. In another example, described in US pre-grant patent publication no. 2013/0070437 A1 (Mar. 21, 2013, inventor: Mohammed et al.) an interposer is stiffened by a stiffening layer pierced by vias 130. As described above, according to some embodiments of the present invention, the interposer is stiffened without running the vias 130 through layer 410. However, some embodiments of the present invention can be used together with the techniques described in U.S. Pat. No. 8,841,752 and/or 2013/0070437 and/or with other techniques.

The invention is not limited to the features and advantages described above. For example, in some embodiments, a die 110 is replaced by a multi-chip module (MCM). The interposer substrate 120S can be an organic substrate and may or may not have high CTE; the invention is not limited to any CTE-matching embodiments. Further, the invention is not limited to use of carrier wafers, nor to other particulars of the structures and processes described above. The invention covers "via last" processes in which the vias 130 are formed after the interposer thinning Other embodiments and variations are within the scope of the invention as defined by the appended claims.

DESCRIPTION OF SOME EMBODIMENTS

The embodiments described in this section illustrate but do not limit the invention. In particular, the invention is not limited to specific processes, dimensions, and other features except as defined by the appended claims.

Figure 4A:
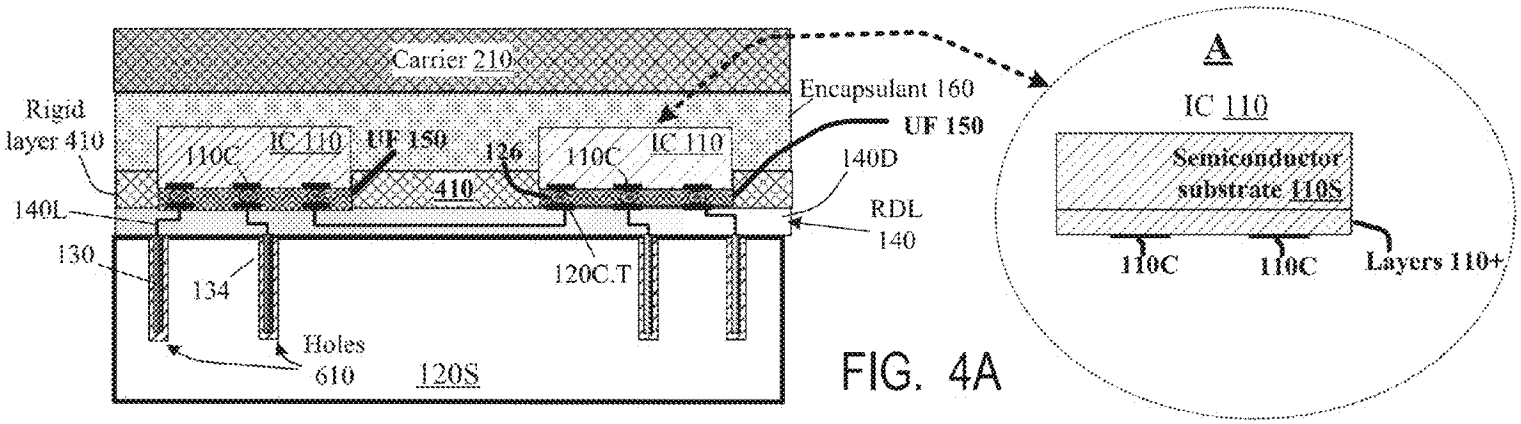
Figure 4B:
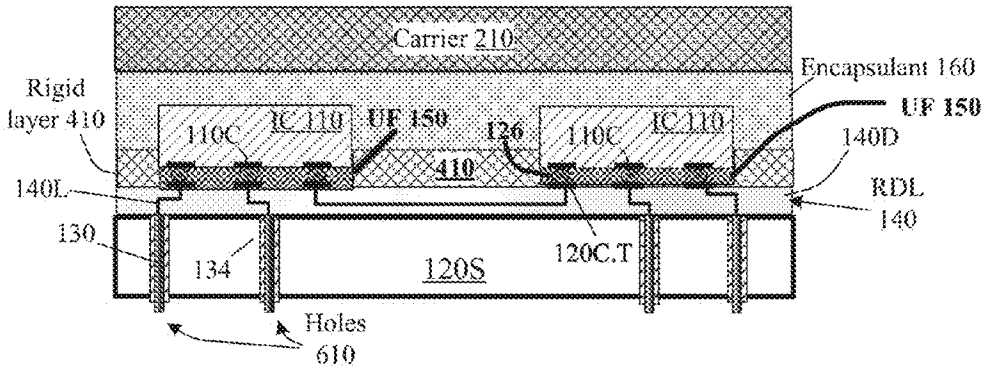
Figure 4C:
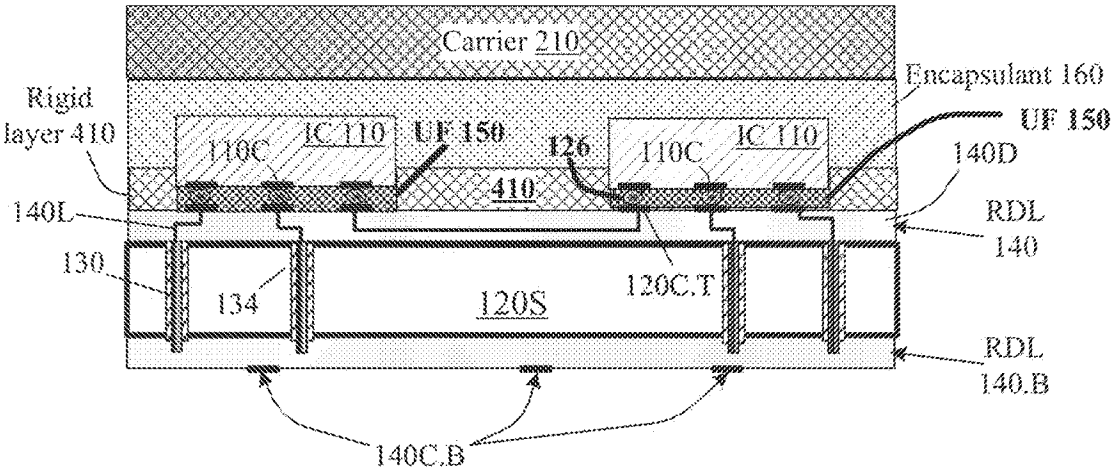
Figure 5:
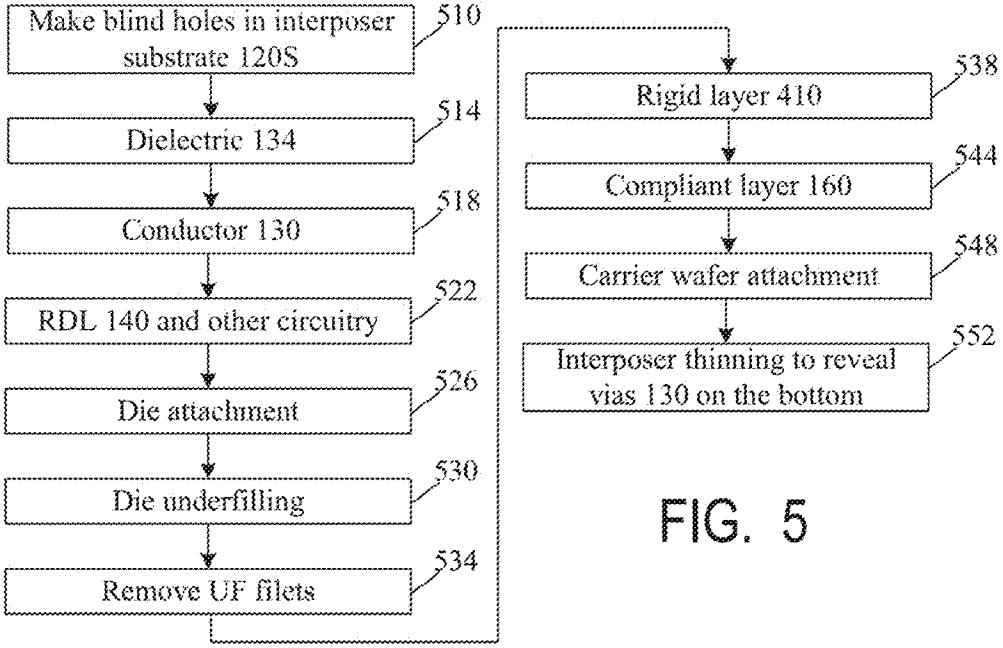
FIG. 5 is a flowchart of a fabrication process according to some embodiments of the present invention.

FIG. 5 is a flowchart of an exemplary fabrication process for some embodiments of the present invention including some embodiments illustrated in FIG. 4B. Interposer fabrication starts with a substrate 120S which can be sufficiently thick to meet the strength, heat dissipation, and possibly other fabrication requirements. In some examples, substrate 120S is a wafer in which multiple interposers are fabricated at the same time. The interposer wafer can be singulated into individual interposers before or after attachment of die 110 to the interposers. For example, multiple assemblies can be fabricated as a single structure based on a single interposer wafer, and each assembly can be as in FIG. 4B or some other type. The multiple-assembly structure can be separated into individual assemblies before or after the interposer thinning.

Substrate 120S may or may not be any material used in prior art, e.g. monocrystalline or non-monocrystalline silicon or other semiconductor material, possibly any of the III-V semiconductors or other semiconductor materials, ceramic (aluminum oxide or other type), glass, sapphire, metal, carbon, and/or possibly other materials and/or their combinations.

Figure 6:
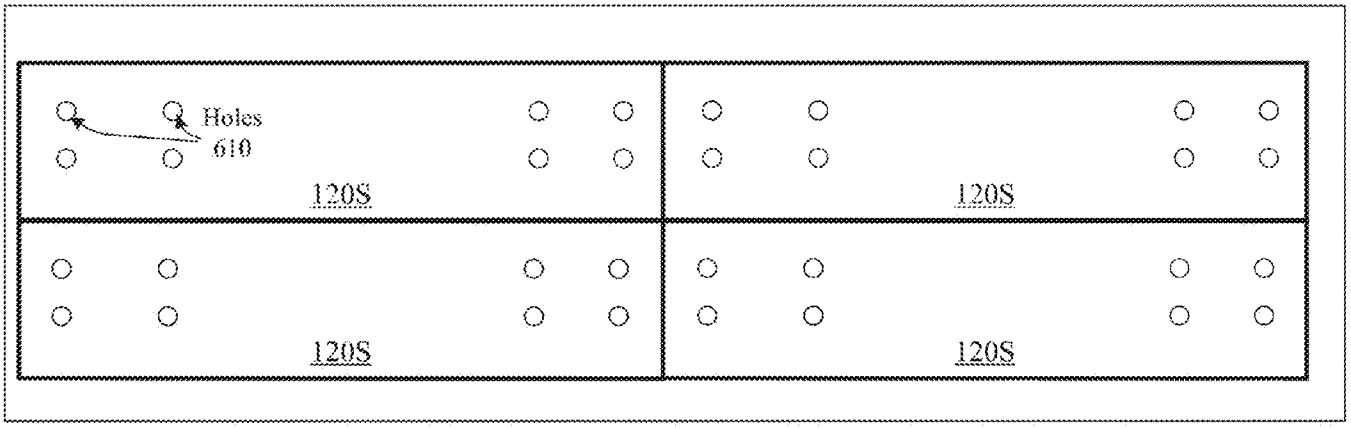
FIG. 6 is a top view of an interposer in the process of fabrication according to some embodiments of the present invention.

Vias 130 may or may not be formed by conventional processes such as described, for example, in U.S. Pat. No. 7,034,401 B2 (Apr. 25, 2006; Savastiouk et al.); U.S. Pat. No. 8,822,336 B2 (Sep. 2, 2014; Tsai et al.); U.S. Pat. No. 8,658,535 B2 (Feb. 25, 2014; Andry et al.); U.S. Pat. No. 6,693,361 (Feb. 17, 2004; Siniaguine et al.); these documents are incorporated herein by reference. For example, in some embodiments, at step 510 of FIG. 5, blind holes 610 (FIG. 4A) are made in the top surface of substrate 120S for vias 130 (the holes are called blind because they do not pass through the substrate). FIG. 6 is the top view of a portion of a wafer with four interposer substrates 120S, each substrate including eight holes 610. Each hole 610 is circular, but can be of any shape; there can be any number of holes, arranged in any pattern.

The holes are lined with dielectric 134 (step 514), possibly silicon dioxide or silicon nitride or tantalum oxide or some other organic or inorganic material or a combination of the such materials. Dielectric 134 can be omitted if substrate 120S is itself dielectric for example. Then holes 610 are filled up, or lined, with conductor 130 (step 518). In some embodiments, conductor 130 is copper or some other metal, or a metal alloy, or doped polysilicon, or some other type. Additional layers such as bather and adhesion layers can also be present; see e.g. the aforementioned U.S. Pat. No. 7,034,401. If the bottom ends of vias 130 will be directly attached to another structure, e.g. PCB 114, then the bottom ends of vias 130 can be formed of suitable materials for the attachment technique. For example, vias 130 may include a thin layer of nickel deposited before copper to provide a nickel soldering surface at each via's bottom.

Dielectric 134 may or may not remain on the top surface of substrate 120S between the holes. (If the dielectric remains between the holes, the dielectric between the holes can be thought of as part of RDL dielectric 140L.)

At step 522, RDL 140 (FIG. 4A) is formed on substrate 120S. RDL 140 may or may not be the same kind as in FIG. 1, and may or may not be formed by conventional processes, e.g. blanket deposition and etch of dielectric and conductive layers. For illustration, dielectric 140D may include layers of silicon dioxide and/or silicon nitride and/or polyimide, and conductive lines 140L can be formed of layers of copper and/or aluminum and/or some other metal. Top contact pads 120C.T can be copper or gold or nickel or a combination of layers depending on the desired type of attachments 126.

The above processes are not limiting. For example, one or more of the features described above can be formed by printing; in fact, entire interposer 120 can be formed by printing. In another example, substrate 120S with holes 610 can be formed by molding (e.g. if the substrate is ceramic or glass or metal or some other material that can be formed by molding).

Additional circuitry (not shown) can be formed in substrate 120S; examples of such circuitry include capacitors, inductors, resistors, transistors, and other elements. Such circuit elements can be connected to vias 130 and/or RDL lines 140L. Such circuit elements can be formed at any suitable stage before and/or between and/or after and/or during the steps 510 through 522 or later steps.

At step 526, die 110 are attached to interposer 120 and electrically coupled to the top contact pads 120C.T. In FIG. 4A, the attachment is a flip-chip type. The die can be similar to a conventional die. The die shown in insert A of FIG. 4A has a semiconductor substrate 110S, additional layers marked "110+", and contact pads 110C. Die substrates 110S can be any semiconductor material (e.g. silicon or semiconductors or carbon semiconductors or other semiconductors), and different die substrates can be different materials, and such die can be used with substrates 120S made of any materials described above. Other die structures are possible; for example, the die could have layers beneath the substrate 110S. Further, the die could be replaced by an MCM having multiple die and/or other microelectronic components, e.g. interposers. The die or module may include any circuitry, possibly with semiconductor devices (e.g. transistors, diodes, and others), capacitors, resistors, and/or other elements. The die's circuitry is not shown except for contact pads 110C.

Figure 7:
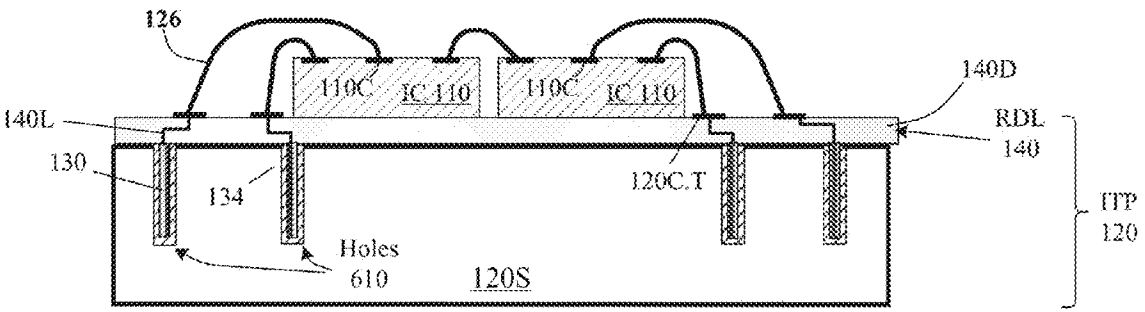
FIGS. 7, 8, 9A, 9B, 10, 11, 12, 13, 14 show vertical cross sections of integrated circuit assemblies in the process of fabrication to illustrate some embodiments of the present invention.

FIG. 7 shows an example where the die 110 are attached to the interposer with their contact pads 110C on top, and the contact pads 110C are connected to the interposer's contact pads 120C.T by discrete bond wires 126. Other types of attachment are possible. Further, multiple dies can be attached sequentially on top of one another to provide a die stack; or the die stack or other multi-chip module (MCM) can be formed separately and then attached to the interposer and connected to contact pads 120C.T.

The die can be underfilled (step 530) with UF 150; see FIG. 4A. Alternatively, the die underfilling can be combined with the die attachment (step 526) if the underfill is no-flow type. The underfill can be omitted even in the flip-chip attachment scheme of FIG. 4A. In fact, in some flip-chip embodiments (e.g. copper-to-copper attachments), the die's bottom surface can be a flat surface with the contact pads 110C being conductive areas surrounded by dielectric; likewise, the top surface of RDL 140 can be a flat surface; and then there would be no gap between the die and the interposer and hence no room or need for underfill.

Figure 1:
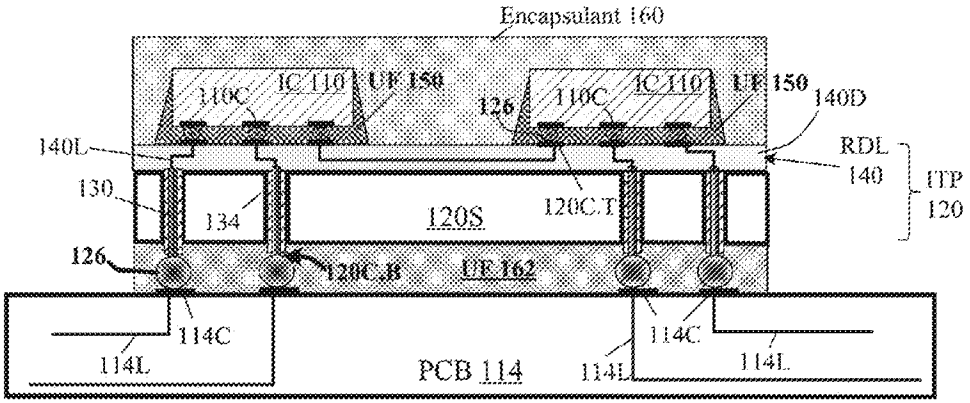
FIG. 1 PRIOR ART
FIG. 1 shows a vertical cross-section of a prior art assembly of integrated circuits.
Figure 2A:
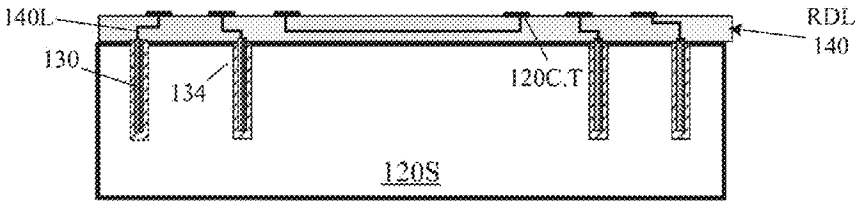
FIG. 2A PRIOR ART
FIGS. 2A, 2B show vertical cross sections of an interposer in the process of fabrication according to prior art.
Figure 2B:
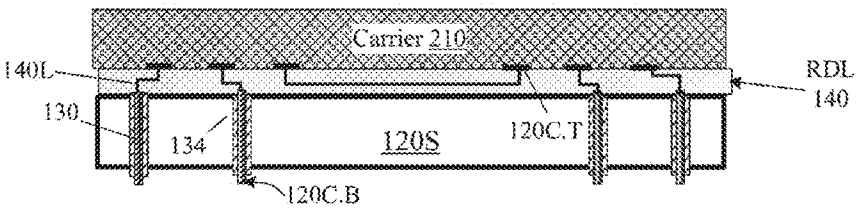
FIG. 2B PRIOR ART
Figure 3A:
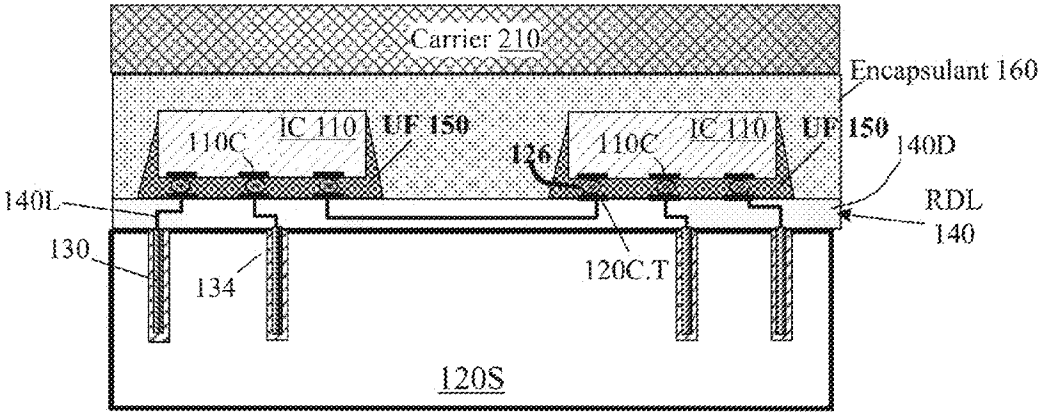
FIGS. 3A, 3B, 4A, 4B, 4C show vertical cross sections of integrated circuit assemblies in the process of fabrication to illustrate some embodiments of the present invention.
Figure 3B:
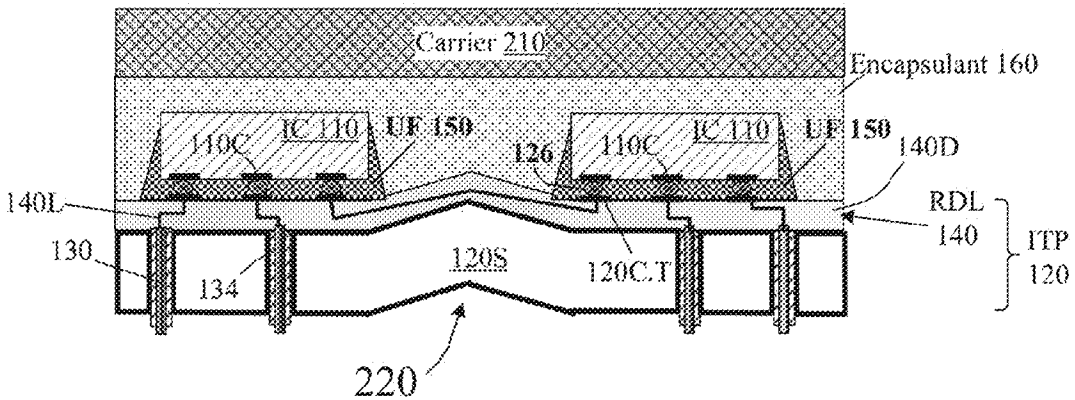
Figure 8:
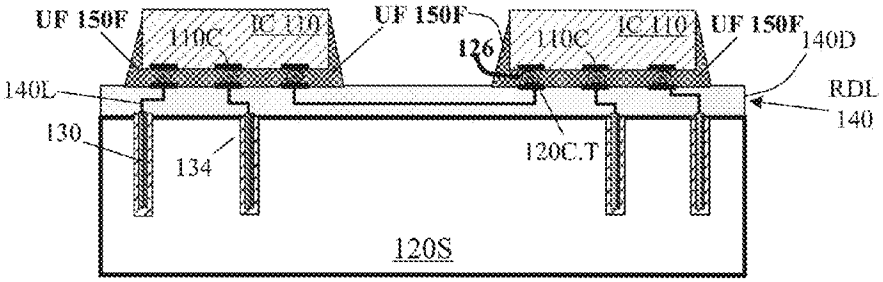

If the die are underfilled, the underfill may initially extend beyond the die as in FIG. 1 or 8. In FIG. 8, the underfill portions surrounding each die (the underfill fillets) are marked 150F. In this case, in some embodiments, the underfill fillets are removed partially or completely (step 534), e.g. by laser, to make more room for layer 410. In some embodiments, the underfill remains only under the die as shown in FIG. 4A. In other embodiments, fillets 150F are left in place.

At step 538, rigid layer 410 is formed on RDL 140. In some embodiments, layer 410 covers all of the interposer 120 between the die 110, reaching the die's sidewalls. In other embodiments, the rigid layer 410 is present only in selected areas between the die, e.g. where dishing may be a problem in later thinning of the interposer. For example, the layer 410 may be present only in large gaps between the die but not in smaller gaps. Layer 410 is sufficiently thick to resist dishing, and may have different thickness in different interposer portions. Depending on the embodiment, any material 410 that is more rigid than encapsulant 160 (i.e. has a lower elastic modulus) may be suitable. In particular, layer 410 may be a resin molding compound more rigid than encapsulant 160; molding compounds are known with elastic moduli as high as 27 GPa for example. Of note, we use the term "resin" to denote organic materials that can be deposited as malleable liquid or semi-solid materials, and can be hardened by cooling or solvent evaporation or heat or ultraviolet radiation or in some other way; the hardening (curing) may or may not involve cross-linking, and may or may not be reversible (e.g. resins can be thermoplastic). Resins may be polymeric before hardening, and/or may be at least partially polymerized in the hardening process. Examples of such materials include certain epoxy, silicone, polyurethane, poly-phenylene benzobisoxazole (PBO), and benzocyclobutene (BCB) materials. In addition to such organic materials, a resin may include organic or inorganic, polymeric or non-polymeric additives like fire retardants or hard-particle fillers (e.g. silica, alumina, aluminum nitride, diamond, carbon nanotubes, and possibly others), which may constitute a large percentage of the resin material, possibly 90% by volume or higher, but they do not destroy the resin ability to be deposited in a malleable form and then hardened.

In some embodiments, layer 410 is chosen to match the CTE (or at least XY CTE) of interposer 120 and/or die 110 as closely as feasible.

In some embodiments, the material 410 has elastic modulus of at least 20 GPa. (In this disclosure, the elastic modulus values are at room temperature unless stated otherwise; if the elastic modulus is anisotropic, the minimal value over all directions is assumed unless stated otherwise). For example, silicon dioxide may have elastic modulus of 46 GPa or higher, and CTE of about 0.5 ppm/° K. If deposited by PECVD (plasma enhanced chemical vapor deposition), the oxide modulus can be as high as 160 GPa, and the CTE can be from 0.2 to 2.0 ppm/° K. PECVD equipment is available from Samco Inc. of Japan and other companies.

Aluminum oxide can be deposited by sputtering at room temperature, or by atomic layer deposition (ALD) at temperatures as low as 100° C. (other temperatures may also be used for sputtering or ALD); the elastic modulus can be 150 to 300 GPa; the CTE can be 4 to 10 ppm/° K.

Additives can be used to adjust the CTE or other parameters of importance depending on any particular requirements. Also, layer 410 may include sub-layers of different materials with different elastic moduli and/or CTEs.

The thickness of layer 410 depends on particular requirements. Thicker layers may be more effective to reduce dishing or stiffen the structure for easier handling. On the other hand, high thickness increases mechanical stresses, especially for high CTE mismatch between the layer 410 and die 110 or interposer 120. An exemplary thickness range is 0.1 to 100 μm for PECVD silicon dioxide or aluminum oxide. In some embodiments, thicker layers 410 are used with thicker die; layer 410 may reach any level from 0.1% to 100% (top) of the thickest die's height (different die may differ in height in the same assembly). In some embodiments, it may be acceptable for layer 410 to reach the top surface of at least one of the die, or to cover one or more (possibly all) of the die.

Layer 410 is shown to have a planar top surface but this is not necessary; for example, layer 410 can be conformal or have other non-uniformities. Any particular surface profile can be obtained by ink-jet printing. For example, nanoparticle ink printing (possibly electrohydrodynamic printing) can be used. In other embodiments, layer 410 is deposited and patterned photolithographically, by laser, or in some other way. Also, if a planar top surface is desired, layer 410 can be deposited to a larger thickness than the tallest die; and layer 410 can then be planarized (by chemical mechanical polishing or some other process). Then layer 410 can be further etched down to a desired final thickness if needed.

In some embodiments, to maximize protection against dishing, layer 410 reaches the rigid sidewalls of die 110. In some embodiments, MCMs are used rather than single die, and the MCMs include compliant encapsulants such as epoxy resins or other polymeric encapsulants, but the MCMs nonetheless have rigid sidewalls exposed for contact with layer 410; the sidewalls can be non-plastic, possibly inorganic, e.g. semiconductor (silicon or other type) or glass or metal or some other rigid material. In some embodiments, the sidewall material has an elastic modulus of at least 20 GPa, and possibly over 50 GPa, possibly over 130 GPa, possibly 300 GPa or higher.

Encapsulant 160 is deposited at step 544 to any desired level, possibly to cover the structure, possibly to provide a planar top surface. The encapsulant can be of organic polymeric type described above (e.g. resin or some other type), made by prior art or other techniques, e.g. molding or printing or CVD or in some other way (e.g. parylene formed by CVD). The encapsulant's elastic modulus is lower than for layer 410. In one example, the encapsulant is a molding compound having elastic modulus of 50 MPa and thickness of 20 μm; layer 410 has elastic modulus of 20 GPa or higher. These examples are not limiting.

Figure 9A:
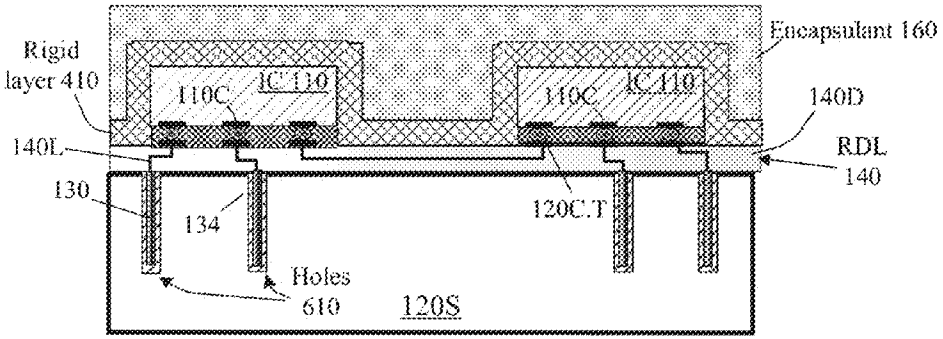
Figure 9B:
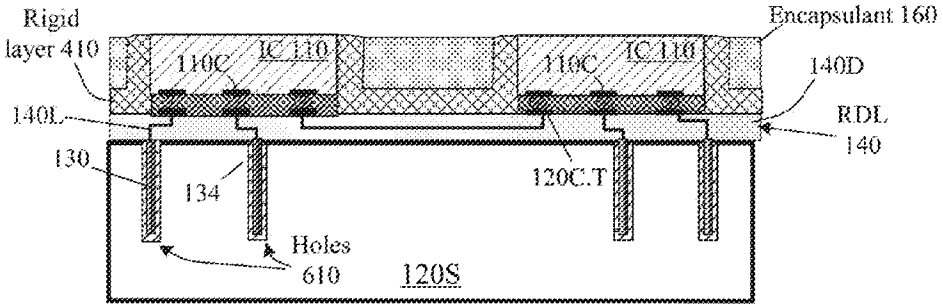

FIGS. 9A-9B show another variation. Layer 410 is conformal. Encapsulant 160 is deposited to cover the layer 410 (FIG. 9A). Then encapsulant 160 and layer 410 are planarized (FIG. 9B), by an etch and/or mechanical polishing (possibly CMP), to expose the tallest die 110 and provide a planar top surface. Planarization can be omitted, i.e. the structure can remain as in FIG. 9A. Alternatively, the layers 410/160 can be etched down to a level below the top surface of a die 110.

If desired, at step 548, carrier wafer 210 is attached to the top surface of the structure (the structure can be of any type described above in connection with FIGS. 4A-9B). The carrier wafer can be rigid (possibly having a higher elastic modulus than encapsulant 160, possibly the same or higher modulus than layer 410), and can have any suitable thickness to provide mechanical strength to the assembly for easier handling. Carrier wafer can be thermally conductive (e.g. silicon, metal, etc.). The carrier wafer can be attached by adhesive for example. In some embodiments, the adhesive is encapsulant 160, and the carrier wafer is attached before the encapsulant is fully hardened. In some embodiments, the carrier wafer is attached after full curing of encapsulant 160, by direct bonding to encapsulant 160. In some embodiments such as in FIG. 9B, the carrier wafer is attached to the exposed portions of rigid layer 410 and/or the exposed top surfaces of die 110, by direct bonding or adhesive.

At step 552, the interposer is thinned from the backside to expose the vias 130. Further processing can be as described above, possibly as in prior art. For example, dielectric (not shown) can be formed on the bottom surface of substrate 120S (see e.g. U.S. Pat. No. 6,693,361 issued Feb. 17, 2004 to Siniaguine et al., incorporated herein by reference). The bottom ends of vias 130 protrude below the dielectric and can be attached to a PCB or other components. Alternatively, an RDL 140.B can be formed on the bottom with contact pads 140C.B connected to vias 130. These contact pads can be attached to a PCB or other components.

Figure 10:
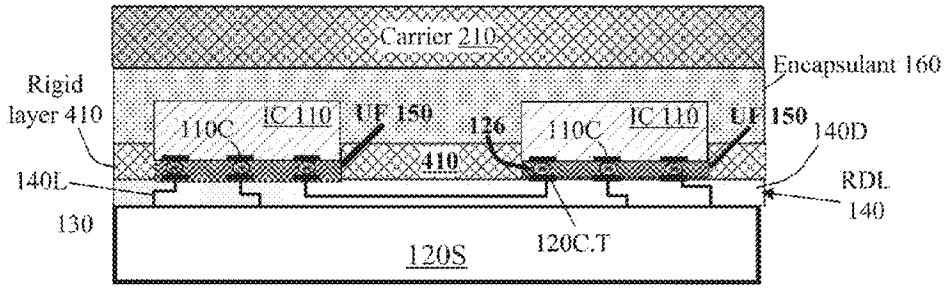

Many variations are possible. For example, as noted above, the vias 130 can be formed by a "via last" process: the fabrication proceeds as described above through the interposer thinning except that no vias 130 are formed, i.e. the steps 510-518 are omitted. FIG. 10 shows the resulting structure corresponding to FIG. 4B (but without vias 130). Then holes 610 are made in the bottom of substrate 120S. These holes pass through the substrate 120S and terminate at RDL 140. Dielectric 134 and conductor 130 are deposited into the holes to provide the structure of FIG. 4B (before the conductor 130 is deposited, dielectric 134 is etched off the RDL conductor 140L to expose the RDL conductor 140L for physical contact with conductor 130). The via-last process is also available for the embodiment of FIGS. 9A-9B and other embodiments described above.

Figure 11:
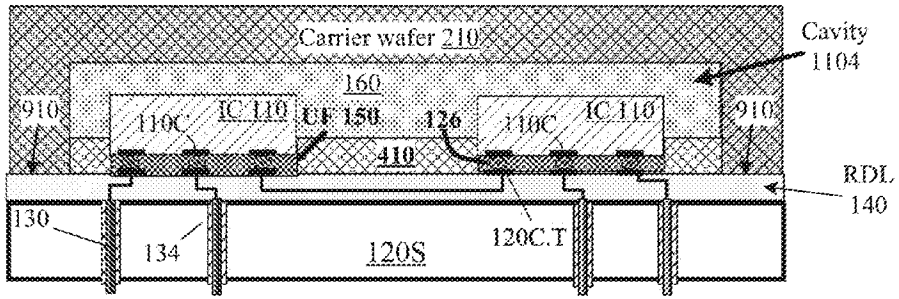
Figure 12:
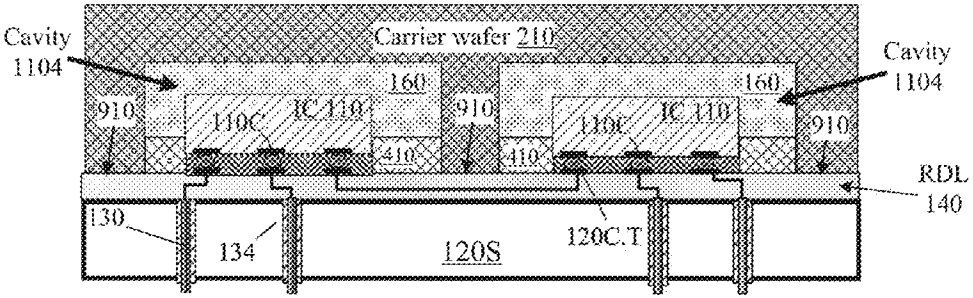

As shown in FIGS. 11 and 12, the carrier wafer may have one or more cavities 1104 each of which may contain one or more of die 110 (or MCMs). The carrier wafer can be attached to interposer 120 next to the cavities, e.g. in regions 910 surrounding each cavity 1104. In the embodiment shown, layer 410 is absent in the attachment regions, and the carrier wafer is attached to RDL 140 (possibly to dielectric 140D). Alternatively, RDL 140 can be absent in the attachment regions, and the carrier wafer can be attached to substrate 120S. In another alternative, layer 410 is present in the attachment regions, and the carrier wafer is attached to layer 410. The attachment can be direct bonding or by adhesive (not shown). The adhesive can be the same material as encapsulant 160 or some other material. The carrier wafer placement can be performed before or after curing of encapsulant 160. In some embodiments, the carrier wafer attachment is performed before introduction of encapsulant 160 into the cavity or cavities; the encapsulant is introduced via through-hole(s), not shown, formed in the carrier wafer.

In FIGS. 11 and 12, rigid layer 410 has a planar top surface, but this is not necessary; a carrier wafer with cavities 1104 can be employed with the structure of FIG. 9A or 9B or other embodiments described above or immediately below.

Figure 13:
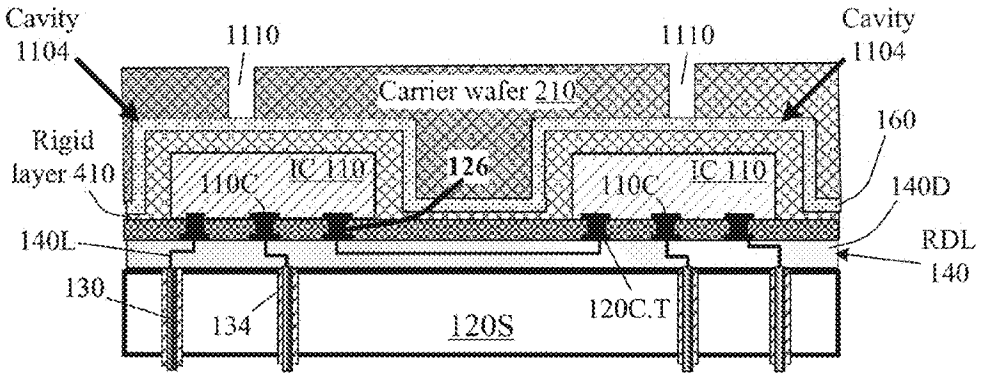

In FIG. 13, carrier wafer 210 has cavities 1104. Rigid layer 410 is a conformal layer overlying the die (like in FIG. 9A). Layer 160 is a thin, conformal adhesive layer, possibly introduced through vent holes 1110 after placement of carrier wafer 210 on the interposer. Alternatively or in addition, the adhesive 160 can be deposited on the carrier wafer's surface and/or the surface of layer 410 before the carrier wafer placement. In either case, vent holes 1110 help drive out the adhesive's solvent if needed in the adhesive curing process. Holes 1110 are optional, and may have any shape and diameter.

As noted above, if interposer substrate 120S is semiconductor, glass, sapphire, metal, ceramic, or some other low-CTE material (compared to cured resins), then rigid layer 410 can be chosen to have a matching XY-CTE. In some embodiments, layer 410 is silicon dioxide or metal or ceramic (e.g. aluminum oxide). In some embodiments, the XY CTE of layer 410 is at least 10%, and at most three times, the XY CTE of substrate 120S or interposer 120 or both. In some of these embodiments, the XY CTE of encapsulant 160 is more than three times the XY CTE of substrate 120S or interposer 120 or both.

Encapsulant 160 can be thin to provide a low combined CTE for the layers 410/160. For example, in some embodiments, layer 410 is PECVD silicon dioxide having a CTE of 0.5 ppm/° K and a thickness of 5 μm to 500 μm; layer 160 is a filled or unfilled organic polymer having a thickness of at most 10 μm, possibly at most 5 μm, possibly no more than 1 μm; the combined XY CTE of layers 140/160 is less than 10 ppm/° K.

Due to its rigidity, layer 410 will resist upward expansion of die 110 if the die's Z-direction (vertical direction) CTE is larger than that of layer 410. To reduce pressure on the die, the Z direction CTE of layer 410 or the combined Z CTE of layers 410/160 or the combined Z CTE of these layers and the carrier wafer 210 should be at least as high as that of die 110. In some embodiments, the Z CTE of each of layers 410 and 160 and of carrier wafer 210 is at least as high as that of die 110. Also, in some embodiments, the Z-CTE of underfill 150 should be low, but this requirement severely restricts the choice of underfills which are usually filled organic polymers. Therefore, in some embodiments, the UF 150 has a high Z-CTE but the UF amount is reduced by reducing the gap between the die and the interposer. UF 150 can be omitted if the die/interposer XY CTEs are closely matched, e.g. within 100% of each other (i.e. each of the two CTEs is at most double the other CTE). In some embodiments, the interposer's top surface (the top surface of RDL 140) is flat, and the die's contact pads 110C are short posts (e.g. copper). In some embodiments, the die's bottom surface is also flat, and no underfill is used.

Figure 14:
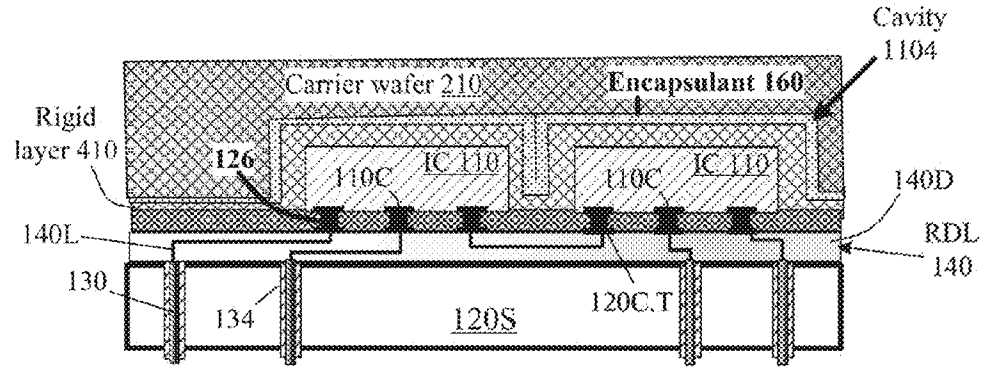

FIG. 14 is similar to FIG. 13 but shows multiple die in single cavity 1104.

The invention is not limited to the embodiments described above. Some embodiments are defined by the following clauses.

1. An assembly comprising:

a first structure (e.g. interposer 120 or a PCB or some other type of wiring substrate or other structure to which the die could be attached, e.g. the first structure can be a semiconductor die) comprising first circuitry (e.g. 130, 140L, 120C.T, 120C.B) comprising one or more first contact pads (e.g. 120C.T) at a top of the first structure;

one or more modules (e.g. integrated circuit die, and/or undiced wafers, and/or MCMs) attached to a top surface of the first structure and electrically connected to at least one first contact pad, at least one module comprising at least one semiconductor integrated circuit;

a first layer (e.g. 410) formed on the top surface of the first structure; and a second layer (e.g. 160) overlying the first layer, wherein the second layer has a lower room-temperature elastic modulus than the first layer;

wherein at least one of the following is true:

(a) the first layer is inorganic;

(b) the first layer is a material different from any material found at an interface between the first structure and at least one of the one or more modules (the materials found at an interface between the first structure and a module may include, for example, an underfill, possibly without fillets extending beyond the area between the two modules; and/or copper; and/or organic or inorganic dielectric (e.g. silicon dioxide) at the surfaces of the module and the interposer; and/or other materials);

(c) the first layer covers all of that portion of said top surface which is not occupied by the one or more modules;

(d) the one or more modules comprise one or more first modules, the assembly comprising underfill between the first structure and each first module, the underfill extending laterally beyond each first module (e.g. to form fillets 150F), and the first layer covers all of that portion of said top surface which is not occupied by the one or more modules and not covered by the underfill.

2. The assembly of clause 1 wherein the first layer physically contacts a sidewall of at least one of the one or more modules at a location where the sidewall has a higher room-temperature elastic modulus than the second layer. For example, at the point of physical contact, the sidewall may be semiconductor material of a die's substrate 110S. The sidewall may include, at other locations, other materials (e.g. in layers 110+) that contact the first layer and have a lower room-temperature elastic modulus than the second layer. Also, part of the sidewall may be covered by underfill (such as 150). Other variations are possible.

3. The assembly of clause 1 or 2 wherein:

the first structure comprises a first substrate supporting the first circuitry (e.g. substrate 120S);

in at least one of the one or more modules, at least one semiconductor integrated circuit comprises a second substrate (e.g. 110S) supporting the semiconductor integrated circuit; and the first substrate and the second substrate have the same coefficient of thermal expansion (CTE) in a plane extending along the first structure. Of note, the substrates may have any composition; e.g. the first substrate may be a laminated substrate made of different laminated layers of respective different materials.

4. The assembly of clause 1, 2 or 3 wherein:

the first structure comprises a first semiconductor substrate supporting the first circuitry;

in at least one of the one or more modules, at least one semiconductor integrated circuit comprises a second semiconductor substrate supporting the semiconductor integrated circuit; and the first semiconductor substrate and the second semiconductor substrate are based on the same semiconductor. For example, both may be silicon or gallium arsenide or some other semiconductor. They may or may not have the same crystalline structure (e.g. one substrate may be monocrystalline while the other substrate may be polycrystalline or amorphous, or the same substrate may have regions of different crystalline structure). They may or may not have the same kind of dopants (or one or both may have no dopants), and each substrate may have differently-doped regions and/or both doped and undoped regions.

5. The assembly of clause 1, 2 or 3 wherein:

the first structure comprises a first semiconductor substrate supporting the first circuitry;

in at least one of the one or more modules, at least one semiconductor integrated circuit comprises a second semiconductor substrate supporting the semiconductor integrated circuit; and the first semiconductor substrate is based on a different semiconductor than the second semiconductor substrate.

6. The assembly of clause 1, 2 or 3 wherein the first structure comprises a non-semiconductor substrate supporting the first circuitry.

7. The assembly of any preceding clause wherein the first structure is an interposer, and the first circuitry further comprises one or more second contact pads at a bottom of the interposer.

8. The assembly of any preceding clause wherein the first layer does not cover at least one of the one or more modules.

9. The assembly of any preceding clause wherein the second layer physically contacts a sidewall of at least one of the one or more modules.

10. The assembly of any preceding clause wherein the first layer is inorganic, and the second layer comprises organic material.

11. The assembly of any preceding clause wherein the second layer is cured resin, but the first layer is not cured resin.

12. The assembly of clause 1, 2, 3, 4, 5, 6, 7, 9, 10 or 11 wherein the first layer covers each module.

13. The assembly of any preceding clause further comprising a carrier member overlying the second layer and having a higher room-temperature elastic modulus than the second layer.

14. The assembly of clause 13 wherein at least one of the one or more modules is at least partially located in a cavity in the carrier member. (The carrier wafer may have more than one cavity, with multiple cavities each containing at least part of a module; a cavity may contain multiple modules or parts thereof.)

15. The assembly of any preceding clause wherein the first structure is an interposer, and for a coefficient of thermal expansion (CTE) in an XY plane extending along the interposer, the XY CTE of the interposer is closer to the XY CTE of the first layer than to the XY CTE of the second layer.

16. The assembly of any preceding clause wherein the first structure is an interposer, for a coefficient of thermal expansion (CTE) in an XY plane extending along the interposer, the XY CTE of the first layer is at least 10%, and at most three times, the XY CTE of the interposer. For example, if the first layer is silicon dioxide with CTE of 0.5 ppm/° K, and the interposer has about the same CTE as silicon (e.g. 2.6 ppm/° K), then the first layer's CTE is less than 20% of the interposer's CTE.

17. The assembly of any preceding clause wherein the first structure is an interposer, the interposer comprises a substrate supporting the first circuitry; and for a coefficient of thermal expansion (CTE) in an XY plane extending along the interposer, the XY CTE of the substrate is closer to the XY CTE of the first layer than to the XY CTE of the second layer.

18. The assembly of any preceding clause wherein the first structure is an interposer, and the interposer comprises a substrate supporting the first circuitry; and for a coefficient of thermal expansion (CTE) in an XY plane extending along the interposer, the XY CTE of the first layer is at least 10%, and at most three times, the XY CTE of the substrate.

19. A manufacturing method comprising:

obtaining an assembly comprising:

a first structure comprising first circuitry comprising one or more first contact pads at a top of the first structure;

one or more modules attached to a top surface of the first structure and electrically connected to at least one first contact pad, each module comprising at least one semiconductor integrated circuit;

forming a first layer on the top surface of the first structure;

forming a second layer overlying the first layer, wherein the second layer has a lower room-temperature elastic modulus than the first layer; and thinning the first structure from a bottom of the first structure while the first layer is present on said top surface of the first structure;

wherein at least one of the following is true:

(a) the first layer is inorganic;

(b) the first layer is a material different from any material found at an interface between the first structure and at least one of the one or more modules;

(c) during the thinning, the first layer covers all of that portion of said top surface which is not occupied by the one or more modules;

(d) the one or more modules comprise one or more first modules, the assembly comprising underfill between the first structure and each first module, the underfill extending laterally beyond each first module, and during the thinning the first layer covers all of that portion of said top surface which is not occupied by the one or more modules and not covered by the underfill.

20. The method of clause 19 wherein said thinning of the first structure comprises a mechanical thinning process.

21. The method of clause 20 wherein the mechanical thinning process comprises chemical mechanical polishing.

22. The method of clause 20 wherein the first layer reduces or eliminates dishing of the first structure in the mechanical thinning process.

23. The method of clause 19, 20, 21 or 22 wherein the first structure is for providing an interposer, and the method provides one or more second contact pads at a bottom of the interposer.

24. The method of clause 23 wherein the one or more second contact pads are part of the first circuitry and become exposed by said thinning.

25. The method of clause 23 further comprising forming additional circuitry in the first structure after the thinning, wherein forming the additional circuitry comprises forming the one or more second contact pads electrically coupled to the first circuitry.

26. The method of clause 19, 20, 21, 22, 23, 24 or 25 further comprising, before said thinning, attaching a carrier member on top of the second layer, the carrier member having a higher room-temperature elastic modulus than the second layer.

27. The method of claim 26 wherein at least one of the one or more modules is at least partially located in a cavity in the carrier member.

28. The method of clause 19, 20, 21, 22, 23, 24, 25, 26 or 27 wherein the first layer is inorganic, and the second layer comprises organic polymeric material.

Other embodiments and variations are within the scope of the invention, as defined by the appended claims.

The invention claimed is:

1. A manufacturing method comprising:

obtaining an assembly comprising a first structure and one or more modules, wherein:

the first structure comprises first circuitry comprising one or more first contact pads at a top of the first structure;

the one or more modules are attached to a top surface of the first structure and electrically connected to at least one first contact pad, each module comprising at least one semiconductor integrated circuit;

after obtaining the assembly, forming a first *electrically insulating* layer on the top surface of the first structure;

forming a second layer overlying the first *electrically insulating* layer, wherein the second layer has a lower room-temperature elastic modulus than the first *electrically insulating* layer; and thinning the first structure from a bottom of the first structure while the first *electrically insulating* layer is present on said top surface of the first structure;

wherein at least one of the following is true:

(a) the first *electrically insulating* layer is inorganic;

(b) the first *electrically insulating* layer is a material different from any material found at an interface between the first structure and at least one of the one or more modules;

(c) during the thinning, the first *electrically insulating* layer covers all of that portion of said top surface which is not occupied by the one or more modules;

(d) the one or more modules comprise one or more first modules, the assembly comprising underfill between the first structure and each first module, the underfill extending laterally beyond each first module, and during the thinning the first *electrically insulating* layer covers all of that portion of said top surface which is not occupied by the one or more modules and not covered by the underfill.

2. The method of claim 1 wherein said thinning of the first structure comprises a mechanical thinning process.

3. The method of claim 2 wherein the mechanical thinning process comprises chemical mechanical polishing.

4. The method of claim 2 wherein the first *electrically insulating* layer reduces or eliminates dishing of the first structure in the mechanical thinning process.

5. The method of claim 1 wherein the first structure is for providing an interposer, and the method provides one or more second contact pads at a bottom of the interposer.

6. The method of claim 5 wherein the one or more second contact pads are part of the first circuitry and become exposed by said thinning.

7. The method of claim 5 further comprising forming additional circuitry in the first structure after the thinning, wherein forming the additional circuitry comprises forming the one or more second contact pads electrically coupled to the first circuitry.

8. The method of claim 5 wherein for a coefficient of thermal expansion (CTE) in an XY plane extending along the interposer, the [XY] CTE *in the XY plane* of the interposer is closer to the [XY] CTE *in the XY plane* of the first *electrically insulating* layer than to the [XY] CTE *in the XY plane* of the second layer.

9. The method of claim 5 wherein for a coefficient of thermal expansion (CTE) in an XY plane extending along the interposer, the [XY] CTE *in the XY plane* of the first *electrically insulating* layer is at least 10% of, and at most three times, the [XY] CTE *in the XY plane* of the interposer.

10. The method of claim 5 wherein the interposer comprises a substrate supporting the first circuitry; and for a coefficient of thermal expansion (CTE) in an XY plane extending along the interposer, the [XY] CTE *in the XY plane* of the substrate is closer to the [XY] CTE *in the XY plane* of the first *electrically insulating* layer than to the [XY] CTE *in the XY plane* of the second layer.

11. The method of claim 5 wherein the interposer comprises a substrate supporting the first circuitry; and for a coefficient of thermal expansion (CTE) in an XY plane extending along the interposer, the [XY] CTE *in the XY plane* of the first *electrically insulating* layer is at least 10% of, and at most three times, the [XY] CTE *in the XY plane* of the substrate.

12. The method of claim 1 further comprising, before said thinning, attaching a carrier member on top of the second layer *through direct bonding*, the carrier member having a higher room-temperature elastic modulus than the second layer.

13. The method of claim 12 wherein at least one of the one or more modules is at least partially located in a cavity in the carrier member.

14. The method of claim 1 wherein the first *electrically insulating* layer is inorganic, and the second layer comprises organic polymeric material.

15. The method of claim 1 wherein (a) is true.

16. The method of claim 1 wherein (b) is true.

17. The method of claim 1 wherein (c) is true.

18. The method of claim 1 wherein (d) is true.

19. The method of claim 1 wherein the first *electrically insulating* layer physically contacts a sidewall of at least one of the one or more modules at a location where the sidewall has a higher room-temperature elastic modulus than the second layer.

20. The method of claim 1 wherein the second layer physically contacts a sidewall of at least one of the one or more modules.

*21. The method of claim 1, wherein the first electrically insulating layer comprises an inorganic dielectric.*

*22. The method of claim 1, wherein the first electrically insulating layer comprises a nitride.*

*23. The method of claim 1, wherein the first electrically insulating layer comprises silicon nitride.*

*24. The method of claim 1, further comprising directly bonding a carrier member to an integrated circuit assembly, wherein the integrated circuit assembly comprises at least the assembly, the first electrically insulating layer, and the second layer.*

*25. The method of claim 1, further comprising, before said thinning, attaching a carrier member on top of the second layer through direct bonding.*

* * * * *